(12) United States Patent
Miyazaki

(10) Patent No.: US 7,269,892 B2
(45) Date of Patent: Sep. 18, 2007

(54) ELECTRIC PART HANDLING DEVICE

(75) Inventor: Mitsuhiko Miyazaki, Higashiosaka (JP)

(73) Assignee: Hakko Corporation, Osaka (JP)

( * ) Notice: Subject to any disclaimer, the term of this patent is extended or adjusted under 35 U.S.C. 154(b) by 386 days.

(21) Appl. No.: 10/688,413

(22) Filed: Oct. 17, 2003

(65) Prior Publication Data
US 2004/0205960 A1 Oct. 21, 2004

(30) Foreign Application Priority Data
Apr. 15, 2003 (JP) ............... 2003-110146

(51) Int. Cl.
*B23P 19/00* (2006.01)
(52) U.S. Cl. ............... 29/739; 29/729; 29/748; 29/750; 29/758; 294/99.2; 294/104; 414/729
(58) Field of Classification Search ................ 29/739, 29/752, 758, 764, 427; 228/51; 219/229–239; 294/104, 116; 414/729; 901/32, 39
See application file for complete search history.

(56) References Cited

U.S. PATENT DOCUMENTS

| 3,804,320 | A | | 4/1974 | Vandermark | |
|---|---|---|---|---|---|
| 4,034,202 | A | * | 7/1977 | Vandermark | 219/230 |
| 4,553,021 | A | * | 11/1985 | Conti | 219/234 |
| 5,033,785 | A | * | 7/1991 | Woolley, Jr. | 294/104 |
| 5,938,258 | A | * | 8/1999 | Femling | 294/104 |
| 6,235,027 | B1 | * | 5/2001 | Herzon | 606/51 |
| 6,750,431 | B2 | * | 6/2004 | Miyazaki | 219/234 |

FOREIGN PATENT DOCUMENTS

JP 7116835 5/1995

\* cited by examiner

*Primary Examiner*—Minh Trinh
(74) *Attorney, Agent, or Firm*—Squire, Sanders & Dempsey LLP

(57) ABSTRACT

A tweezer-type hand-held device for installing and removing an electric part on and from a substrate. The device is provided with a pair of legs biased to close such that the part is held between the legs by the biasing force when the part is installed on the substrate. In an embodiment, one of the legs may be biased in two directions, i.e. in a direction to open and in another direction to close, and a switching member is disclosed to switch the biasing direction. The biasing member may include a spring commonly used for the biasing in the two directions. Manipulation portions are provided for open or close the legs against the force of the biasing member.

9 Claims, 7 Drawing Sheets

ELECTRIC PART HANDLING DEVICE

CROSS-REFERENCE TO RELATED APPLICATIONS

This application is based on Japanese patent application serial No. 2003-110146, filed in the Japan Patent Office on Apr. 15, 2003, the contents of which are hereby incorporated by reference.

BACKGROUND OF THE INVENTION

1. Field of the Invention.

The present invention relates to a device for handling an electric part such as resistor, capacitor and IC, and more particularly pertains to a hand-held tweezer type device for holding the electric part between a pair or legs. The device may be used for heating and reflowing solder at joints between the part and the substrate to solder or desolder the part and holding the part between a pair of legs to install or remove the part on or from a substrate. It is to be noted that the term electric part include not only ordinary electric part such as a resistor and capacitor but also electronic part such as transistor, diode and IC.

2. General Background and State of the Art.

Known is a hand-held tweezer type soldering iron having a pair of legs pivotally connected with each other such that the legs turn or swing toward and away from each other to hold an electric part. A Japanese laid-open patent application No. 07-116835 discloses a hand-held tweezer type soldering iron having a compression spring interposed between the pair of legs to open the legs in free condition where no operating force is exerted on the legs. An operator may exert an operating force to close tips of the legs against the force of the compression spring and hold an electric part between the tips. The soldering iron is provided with heaters within the tips and the tips are bent inwardly to hold the electric part therebetween.

The conventional device is inferior in efficiency of operation for mounting or installing an electric part, since it requires the operator to exert a large force for closing the legs against the force of the spring and holding the electric part between the tips while holding the device. Especially, it is difficult for the operator to position and install a small electric part on a substrate since the operator is required to make delicate positioning of the part while holding the part with a large operating force.

In addition, as the conventional device has the legs with tips inwardly bend at their end portions, it causes an dead angle to obstruct view of the part and a part installing position when the part is carried to the installing position and installed there. This inconvenience is significant especially when a small part is handled.

INVENTION SUMMARY

It is a primary object of the present invention to provide a handheld tweezer-type electric part handling device for holding an electric part in an efficient way.

It is another object of the present invention to provide a handheld tweezer-type device which enables delicate positioning of an electric part on a substrate upon installation of the part.

It is further object of the present invention to provide a handheld tweezer-type heating device which minimizes the dead angle when the part is carried to the installing position and installed there.

It is still another object of the present invention to provide a handheld device for installing and/or removing an electric part on or from a substrate and which enables an operator to hold the electric part without exerting large force to the device.

To attain one or more of the above-mentioned objects, a handheld electric part handling device according to the present invention comprises a pair of first and second legs respectively provided, at their free ends, with contact pieces for holding the part therebetween; at least the first leg being movable toward and away from the second leg to close and open the legs; and a first biasing member for biasing the first leg in the direction to close the legs.

According to an aspect of an embodiment of the present invention, the first biasing member is arranged to exert such a biasing force that the part held between the contact pieces will not drop by its self-weight.

According to another aspect of an embodiment of the present invention, a common biasing member serves as the first biasing members for biasing the first leg in a first direction to close the legs and as a second biasing members for biasing the first leg in a second direction to open the legs, and the switching member is arranged to switch the biasing direction of the common biasing member.

According to still another aspect of an embodiment of the present invention, the handheld electric part handling device comprises a manipulation member manipulated to open and close the legs against the biasing force of the first and second biasing members or a common biasing member, the manipulation member having a first portion manipulated against the biasing force in the first direction, and a second portion manipulated against the biasing force in the second direction.

The above and other features, objects and advantages of the present invention will become more apparent from reading the following description of a preferred embodiment with reference to the following drawings.

BRIEF DESCRIPTION OF THE DRAWINGS

FIGS. 1A and 1B are front elevations of an external appearance of a hand-held tweezer-type device according to an embodiment of the present invention, the device being in a condition biased to close the legs and wherein FIG. 1A shows a free condition of the device and FIG. 1B shows operated or manipulated condition of the same;

FIGS. 2A and 2B are front elevations of the device shown in FIGS. 1A and 1B, in a condition biased to open the legs and wherein FIG. 2A shows a free condition of the device and FIG. 2B shows operated or manipulated condition of the same;

FIGS. 3A and 3B show internal configuration of the hand-held device shown in FIGS. 1A and 1B, the device being in free condition, and wherein FIG. 3A shows the condition where the legs are biased in a opening direction, and FIG. 3B shows the condition where the legs are biased in a closing direction;

FIGS. 4A and 4B are fragmentary enlarged view of the device, wherein FIG. 4A illustrates mechanism relating to a biasing spring, and FIG. 4B is a cross-sectional view taken along line III-III of FIG. 4A;

FIGS. 6A, 6B and 6C show a leg portion of the device, wherein FIG. 6A is a front elevation, FIG. 6B is a plane view and FIG. 6C is a left-side view of the leg;

FIGS. 7A and 7B are sectional views of the leg, wherein FIG. 7A is a cross-section taken along IV-IV of FIG. 6B, and FIG. 7B is a fragmentary enlarged cross-section of an end portion of the leg;

FIGS. 9A, 9B, 9C and 9D are front elevations of the device in operation, wherein FIG. 9A shows the device carrying an electronic part to be installed on a substrate, FIG. 9B shows the device in a condition V-V where the electronic part is about to be installed on the substrate, FIG. 9C shows a condition just after the electronic part has been installed on the substrate, and FIG. 9D shows a condition some time after the installation of the electronic part;

FIGS. 10A, 10B and 10C show a modification of a tip, wherein FIG. 10A is a front elevation, FIG. 10B is a plane view and FIG. 10C is a left-side view of the tip; and FIGS. 11A, 11B and 11C show another modification of the tip, wherein FIG. 11A is a front elevation, FIG. 11B is a plane view and FIG. 11C is a left-side view of the tip.

DETAILED DESCRIPTION OF THE PREFERRED EMBODIMENTS

Figure 1A:
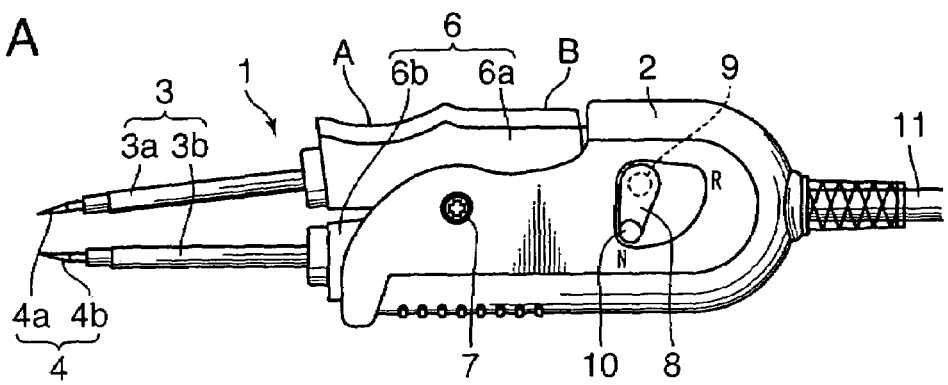
Figure 1B:
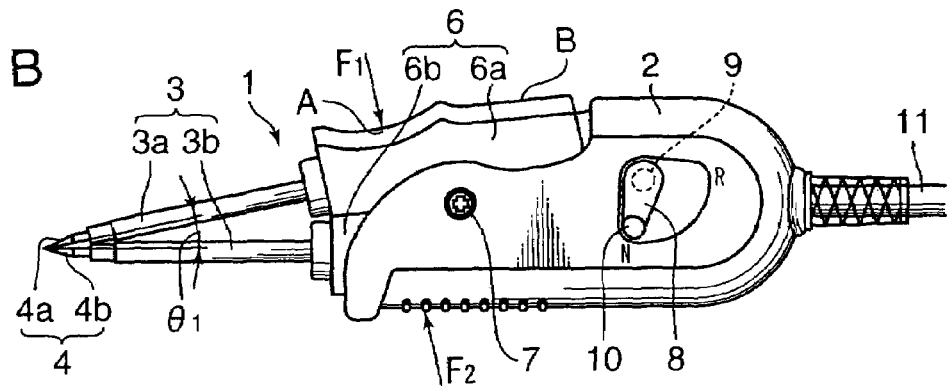
Figure 2A:
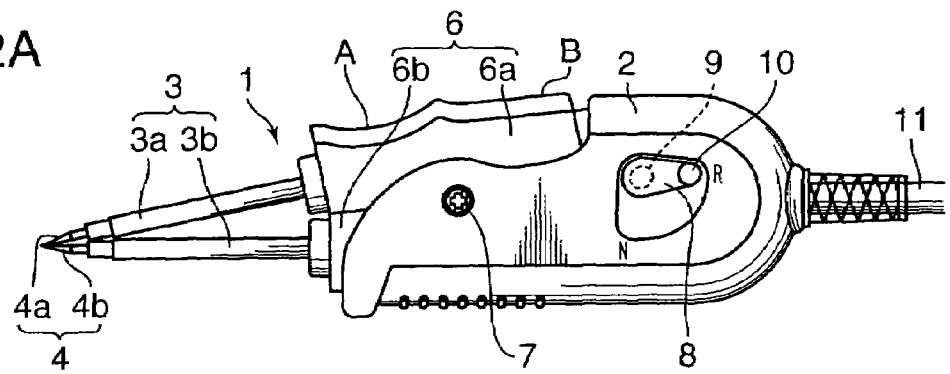
Figure 2B:
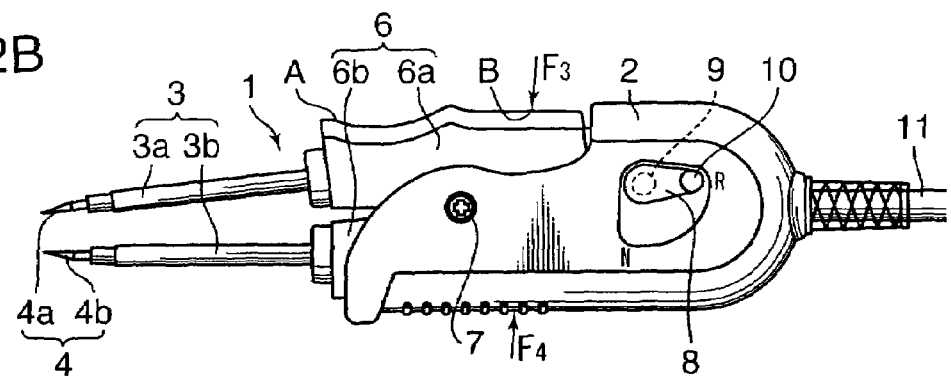

Description will be made of an embodiment of the present invention with reference to the accompanying drawings wherein like reference characters and numerals refer to like parts. FIGS. 1 and 2 show a hand-held tweezer type electric part installing and/or removing device 1 according to an embodiment of the present invention. The device 1 has a pair of legs 3 (3a and 3b) which are biased to open in a normal bias condition of the device 1 such that the legs assume open positions as shown in FIG. 1A in a free condition when no operating force is exerted to the device 1. In a reverse bias condition of the device 1 as shown in FIG. 2A, the legs 3 are biased to close in a free condition when no operating force is exerted to the device 1. Referring to FIGS. 1 and 2, FIGS. 1A and 2A respectively show free condition of the device 1, while FIGS. 1B and 2B respectively show operated or manipulated condition of the device 1 where an operating force is exerted to the device 1 by an operator or user. In the following description, the left side of the device 1 shown in FIG. 1 is referred to as a front side, while the right side is referred to as a rear side. The upper side in the figure is referred to as an upper side of the device 1 and the lower side is referred to as a lower side of the device 1. The front side of the drawing is referred to as a front side of the device 1, while the back side of the drawing is referred to as the back side of the device 1.

The electronic part installing and/or removing device 1 is provided with a housing 2 which is thin and of the shape convenient for grasping. Sleeves 6 (6a and 6b) for respectively holding legs 3 (3a and 3b) are provided in the housing 1. Of the sleeves 6, the upper side sleeve 6a is movable relative to the housing 2 while the lower side sleeve 6b is fixed on the housing 2 to be stationary during operation. The movable sleeve 6a is pivoted on the housing 2 by a supporting shaft or stud 7 to pivot around the supporting shaft 7. The movable sleeve 6a is formed with recesses A and B which serve as manipulation portions to be manipulated or operated by the operator and which facilitate the operation.

A pair of legs 3 (3a and 3b) respectively extend from the sleeves 6 (6a and 6b). In more detail, the leg 3a is fixedly supported by the sleeve 6a and extends therefrom. The leg 3b is fixedly supported by the sleeve 6b and extends therefrom. Near the free end of the legs are respectively provided heaters as will be described later to generate heat for melting solder. Tips 4 (4a and 4b) are respectively provided at the free ends of the legs 3. In more detail, the tip 4a is fixedly installed on the free end of the leg 3a, while the tip 4b is fixedly installed on the free end of the leg 3b. The heat generated by the heaters built in the legs 3 is conducted to the tips 4 which serve as contact pieces to clamp and hold an electric part therebetween while heating the part.

As seen in the figure, the legs 3 and tips 4 are aligned to be substantially straight such that dead angle is small when the tip 4 grasp or clamp an electronic part, thereby improving efficiency of operation in handling a small electronic parts. In addition, the straight structure of the legs and tips provides narrow clamp angle and facilitates installation and removal of a part in a narrow area. The clamp angle is an angle made by the legs 3a and 3b and tips 4a and 4b when a part is held between the tips 4a and 4b.

A power supply code or wire 11 extends from the rear of the housing 2 to supply electric power to the device 1 from a main control (not shown in the figure). The electric power supplied through the code or wire 11 serves to energize the heater.

A biasing condition switching lever 8 is provided on the front surface of the housing 2 at a rear side thereof. The switching lever 8 is fixed on a supporting shaft 9 to turn therewith around the axis of the supporting shaft 9 and switch the biasing condition of the movable leg 3a between a normal bias condition for biasing the movable leg 3a to open the legs 3 and a reverse bias condition for biasing the movable leg 3a to close the legs 3. A switching lever knob 10 is provided at or close to a free end of the switching lever 8 so that the operator or user may turn the switching lever 8 by holding the knob 10. The switching lever knob 10 is selectively registered with marks "N" and "R" to indicate a set biasing condition. The mark "N" represents that the lever is set to a normal position for the normal biasing condition, and the mark "R" represents that the lever is set to reverse position for the reverse biasing condition.

In the free condition in normal bias condition, the legs 3 assume open positions as shown in FIG. 1A. When the operator depresses the manipulation portion A downward with a force F1 which overcomes the biasing force for opening the legs, a counterclockwise moment is exerted on the sleeve 6a and the movable leg 3a, and the movable leg 3a turns counterclockwise around the supporting shaft 7 to close the legs 3. The force F2 is a reactive force or drag exerted in the direction opposite to the direction of the force F1 with a same magnitude with that of the force F1. Thus, the operator may grasp the housing 2 and apply the forces F1 and F2 to the housing 2 and the movable sleeve 6a from the opposite sides to close the legs 3.

The movable leg 3a and the stationary leg 3b make an angle of 12° as an included angle θ1 made by the legs 3a and 3b at their closed condition. It is preferable that the included angle is 12° or in the vicinity of 12° preferably 10°~14°. If the included angle θ1 is smaller than 10°, the distance from the operator's hand gripping the housing to the ends of the tips 4 is so large that it is difficult for the operator to adjust the position of the tips 4 delicately. If the included angle θ1 is larger than 14°, the dead angle increases at the time of grasping or clamping of the part and it is difficult to install or remove an electric part in a narrow area. According to the present embodiment, as the legs 3 and tips 4 extend substantially straight and the included angle of the legs 3 at their closed condition is 10°14°, most preferably 12°, delicate positioning of the tips 4 is available and the dead angle at the time of grasping a part is small to improve visibility of the part during handling of the part. In addition, it is easy to install and remove the part on and from a substrate in a narrow area.

The legs 3 assume a closed condition as shown in FIG. 2A at the free condition in the reverse bias condition. When the recess B in the rear of the sleeve 6a which is in the reverse biased condition, is depressed down by the operator with a force F3 overcoming the biasing force for opening the legs 3, the sleeve 6a and leg 3a moves from the free position shown in FIG. 2A to the operated or manipulated position shown in FIG. 2B. The operating force F3 causes a clockwise moment around the supporting shaft 7, the moment acting on the movable leg 3a supported by the movable sleeve 6a to open the legs 3. A reactive force F4 acts in the direction opposite to the force F3 with the same magnitude as that of the force F3. The operator may grasp the housing 2 and the movable sleeve 6a, applying the forces F3 and F4 from opposite sides to open the legs 3 against the reverse biasing force.

Figure 3A:
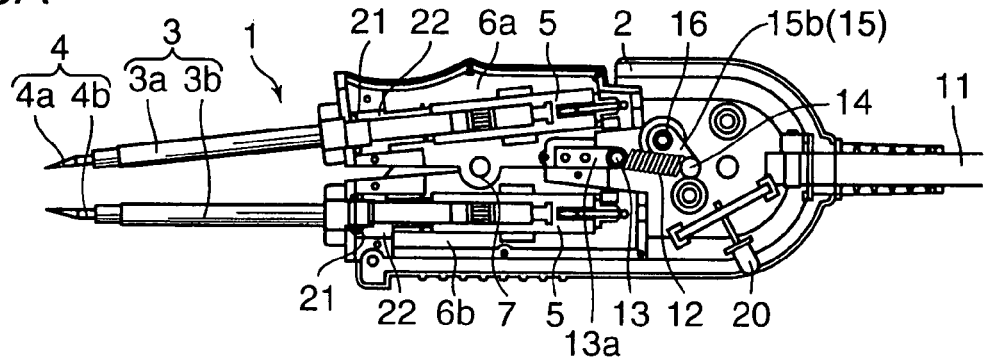
Figure 3B:
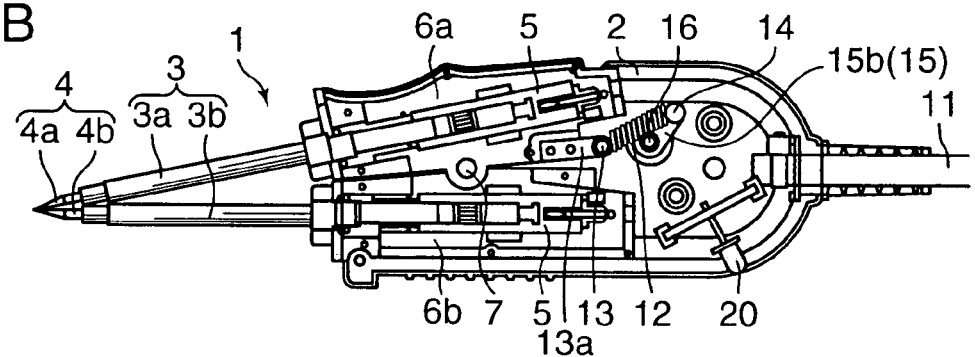

FIGS. 3A and 3B show internal structure of the housing 2 and the sleeves 6 of the electronic part handling device 1. FIG. 3A shows the device 1 in the free condition in the normal bias condition. FIG. 3B shows the device 1 in the free condition in the reverse bias condition. As shown in those figures, a socket 5, O-ring 31 and a leg fixing chuck 22 are assembled interior of each sleeve 6 and the legs 3 are fixedly held by the sleeves 6 respectively with the legs 3 being fitted in the sockets 5. An LED 20 is provided on the rear downward position of the housing 2 to indicate whether the heaters built-in the legs has been calibrated with respect to its heat.

A tension coil spring 12 is provided within the housing 2 at its vertically central and horizontally rearward position to bias the legs 3 to selectively open and close the legs. The coil spring 12 serves as a biasing member commonly used for biasing or urging the movable sleeve 6a and the movable leg 3a toward opening direction in the normal bias condition and toward closing direction in the reverse bias condition. The biasing force of the coil spring 12 is obtained as a restoring force of the spring 12 extended in its tensioning direction.

Figure 4A:
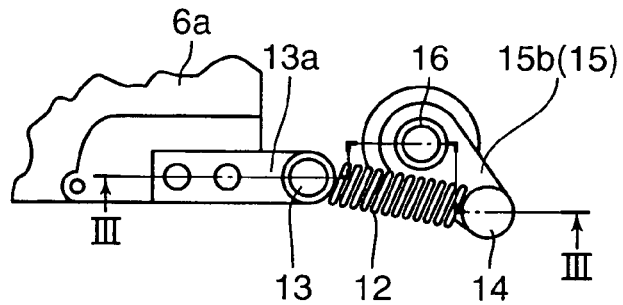
Figure 4B:
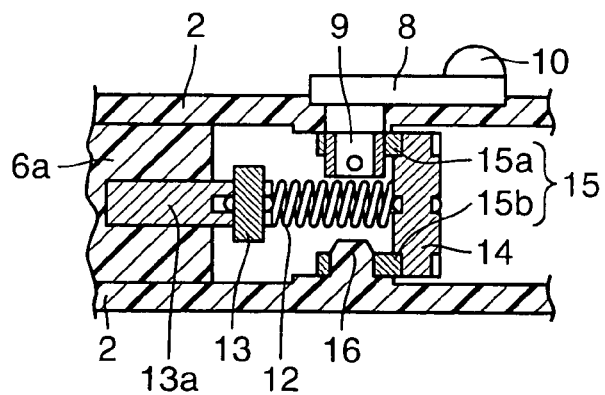

FIG. 4A is an enlarged view of the mechanism around the coil spring 12 shown in FIG. 3, and FIG. 4B is a cross-section taken along III-III of FIG. 4A. A first spring support rod 13 is fixed on a link member 13a which, in turn, is fixed on a rear end of the movable sleeve 6a. The first spring support rod 13 extends horizontally in the direction from the front to the back of the housing. One end of the coil spring 12 is connected to the first spring support rod 13, with a circular end of the coil spring 12 being wound around the support rod 13 and the circular end being allowed to rotate around the rod 13. The other end of the coil spring 12 is connected to a second spring support rod 14 carried on a first and second swingable links 15, with another circular end of the coil spring 12 being wound around the support rod 14 and the circular end of the coil spring 12 being allowed to rotate around the rod 14.

The second spring support rod 14 is connected to the first swingable link 15a at a front side end (upper end in FIG. 4B) of the rod 14. The first swingable link 15a is fixed on a switching lever supporting shaft 9 to turn therewith. The second spring support rod 14 is connected to the second swingable link 15b at a back side end (lower end in FIG. 4B) of the rod 14. The second swingable link 15b is rotatably supported by a swingable link support stub 16 which is integrally formed on the back side wall of the housing 1 to project therefrom. The switching lever supporting shaft 9 and the swingable link support stub 16 are coaxially aligned with each other.

Accordingly, the first and second swingable links 15a and 15b (collectively referred to as swingable links 15 hereinafter) form a link for shifting the second spring support rod 14. As the switching lever 8 is turned, the second spring support rod 14 and the rear end of the coil spring 12 turn around the common axis of the switching lever supporting shaft 9 and the swingable link support stub 16. In the normal bias condition as shown in FIG. 3A, the second spring support rod 14 is located at a relatively lower position so that the coil spring 12 inclines downward to the right. In the reverse bias condition as shown in FIG. 3B, the swingable links 15 have been swung from the normal bias position shown in FIG. 3A to the reverse bias position shown in FIG. 3B so that the second spring support rod 14 is located at a relatively upper position, with the coil spring 12 inclining upward to the right. In this way, the switching lever 8, the switching lever supporting shaft 9 and the swingable links 15 serve to switch the biasing condition of the coil spring 12.

Figure 5:
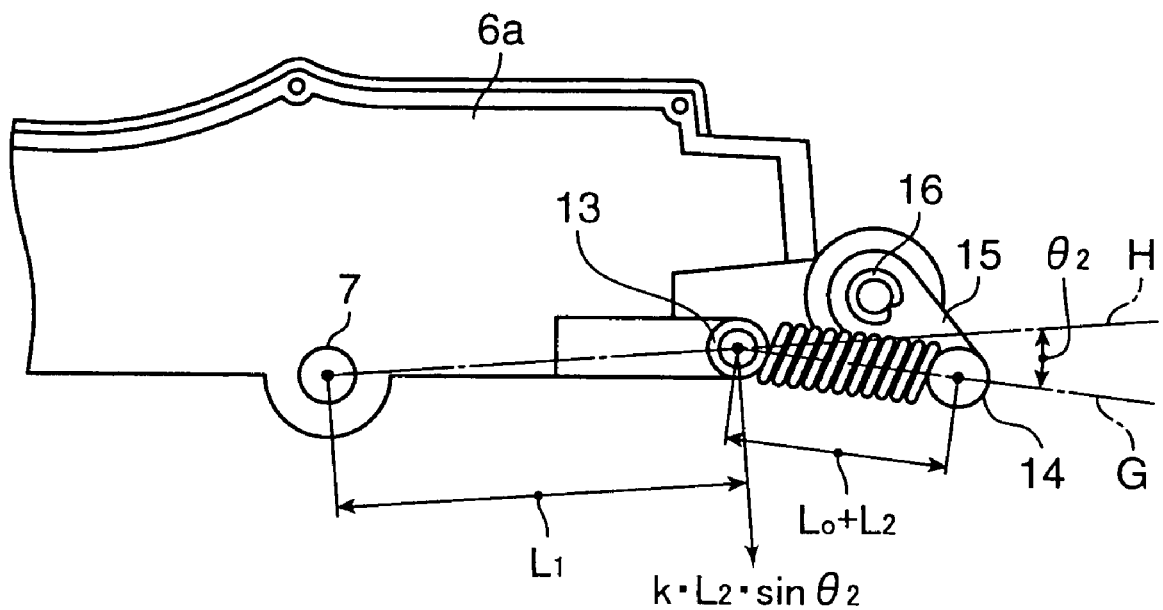
FIG. 5 schematically illustrates moment caused by the biasing spring.

FIG. 5 illustrates a moment caused by the coil spring 12 and acting on the movable sleeve 6a. In the figure, the swingable link 15 and the movable sleeve 6a assume normal and free positions. The movable sleeve 6a can turn around the supporting shaft 7. The first spring support rod 13 serves as a power point through which the moment is applied to the movable sleeve 6a. In FIG. 5, the second spring support rod 14 is below the line H passing the axis of the supporting shaft 7 and the axis of the first spring support rod 13 so that the restoring force of the coil spring 12 acts downward on the first spring support rod 13, thereby causing in the movable sleeve 6a a clockwise moment around the supporting shaft 7. The magnitude of the moment is shown by a following equation (1)

$$M = k \cdot L1 \cdot L2 \cdot \sin \theta 2 \tag{1}$$

Wherein k is a spring constant of the coil spring 12, L1 is a distance between the axis of the supporting shaft 7 and the axis of the first spring support rod 13, L2 is an amount of expansion of the coil spring 12 (the sum of the length of the coil spring 12 in a free condition and the amount of the expansion of the coil spring 12 is equal to the distance between the axis of the first spring support rod 13 and the axis of the second spring support rod 14), and θ2 is an angle made by the straight line H and the straight line G passing through the axes of the first spring support rod 13 and the second spring support rod 14.

As described above, a clockwise moment acts on the movable sleeve 6a in the normal condition, the movable leg 3a is urged to open the legs 3.

In a reverse condition, the second spring support rod 14 is above the line H so that the sign for θ2 is opposite to that in the case of normal condition. Accordingly, counterclockwise moment acts on the movable sleeve 6a to bias the movable leg 3a in the direction to close the legs.

In the embodiment described above, a single coil spring 12 is commonly used as a first biasing member for biasing a leg in a leg opening direction and as a second biasing member for biasing the leg in a leg closing direction. The biasing condition switching lever 8, the supporting shaft 9, the second spring support rod 14 and the swingable links 15 together serve to switch the biasing condition of the coil spring 12. Accordingly, the tweezer-type electric part handling device 1 according to the embodiment is compact in size and easy to operate, providing improved efficiency of operation, and contributing to reduction of the production cost of the device 1.

The inter-axial distance L2 and the angleθ2 may be changed in accordance with the positions of the supporting shaft 9 and the swingable link support stub 16. In addition, it is possible to differ the magnitude of moment M in the normal and reverse conditions.

The moment M in the normal condition is set to a relatively small value so far as inadvertent closing of the legs will not occur by the weight of the movable leg 3a and movable sleeve 6a or by their vibration. Accordingly, the force for closing the legs 3 by the operator (the operational force F1 shown in FIG. 1B) may be as small as possible to thereby lessen the load of the operator. In the reverse condition, on the other hand, the moment M is set to a relatively large value so that an electric part held by the tips 4a and 4b may not drop by its self-weight, the moment being more larger than the value necessary not to cause inadvertent opening of the legs by the self-weight or vibration of the movable leg 3a and movable sleeve 6a. Accordingly, an electric part is held between the tips 4a and 4b without operating force being applied to the movable sleeve 6a.

Figure 6A:
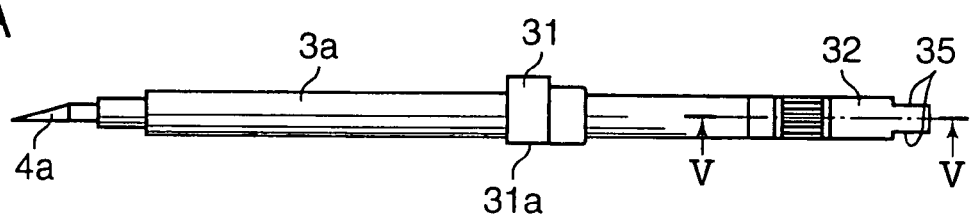
Figure 6B:
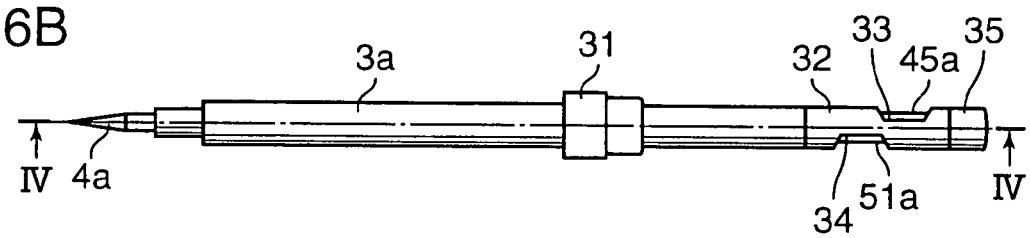
Figure 6C:
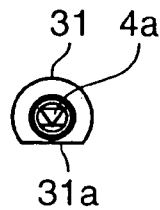
Figure 7A:
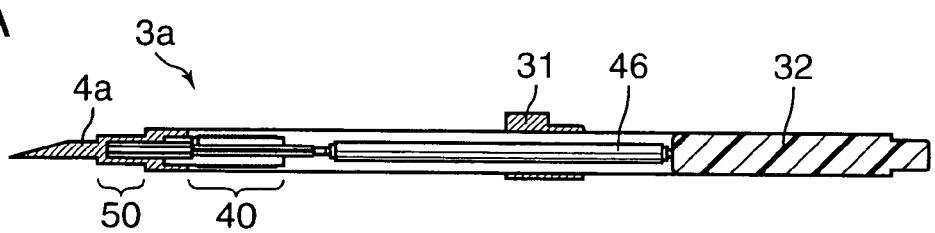
Figure 7B:
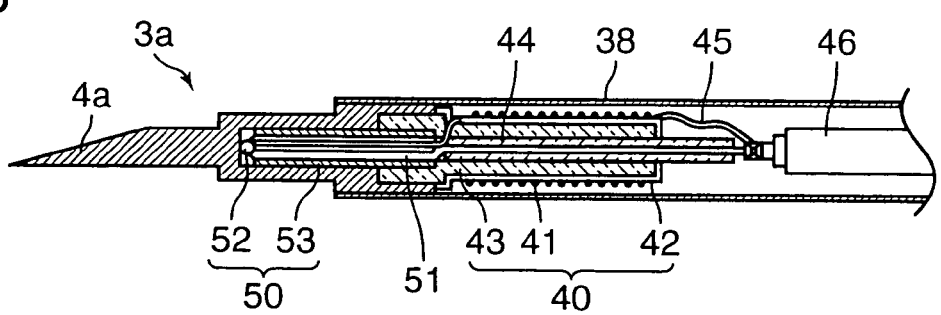

FIG. 6 shows an outer appearance of the movable leg 3a which is to be inserted in the movable sleeve 6a. FIG. 6A is a front elevation, FIG. 6B is a plane view and FIG. 6C is a left side view of the movable leg. FIG. 7A is a cross-section taken along IV-IV of FIG. 6B. FIG. 7B is an enlarged fragmentary view of free end of the tip. The movable leg 3a includes a movable tip 4a fitted in a front portion of a protective pipe 38 of stainless steel, and plug 32 of a synthetic resin inserted in the rear of the pipe 38. The tip is made of a metal including copper or silver as a principal component. A fixing pipe 31 is provided on the middle portion of the protective pipe 38 somewhat rearward of the protective pipe 38. The fixing pipe 31 is formed with a partial flat portion 31a. When the movable leg 3a is inserted in the movable sleeve 6a, the movable leg 3a is fixed in the movable sleeve 6a at the portion of the fixing pipe 31, with the flat portion 31a being fitted to corresponding flat portion (not shown) of the movable sleeve 6a to determine rotational position of the movable leg 3a relative to the movable sleeve 6a. The plug 32 is formed with a flat plane 35 at its rear end to determine rotational position of the movable leg 3a relative to the movable sleeve at the portion of the plug 32.

A heater 40 is provided within the protective pipe 38 at its front portion, with the heater 40 extending to the rear of the tip 4a. The heater 40 is electrically energized to generate heat. A heater core 43 is provided at a radially central portion of the heater 40 with the tip portion of the heater core 43 being embedded in the rear portion of the tip 4a of the movable leg 3a. A heater core cover 42 covers the exposed portion of the heater core 43. A heating coil 41 is wound around the heater cover 42. Thus, the heat generated by the heating coil 41 is conducted to the heater core 43 via the heater cover 42 and to the tip 4a of the movable leg 3a via the heater core 43 so that the tip 4a is heated up to 350°-400° C. to serve as a soldering and/or desoldering iron.

It is common with conventional soldering iron or electric part soldering and/or desoldering device that a heater is provided within a tip. In other words, the heat generated by a heater coil is conducted radially outward to heat the tip. In such conventional devices, it is likely that the diameter of the tip is large in size. Accordingly, it is necessary to bend the end portion of the tip inwardly in order to keep relatively small the distance from the heater to the end of the tip. If the distance is large, efficiency of heat conduction and heat response will be lowered. According to the present embodiment, the protective pipe 38 and tip 4a of the movable leg 3a are small in diameters so that heater 40 and tip 4a may take a straight shape. With this structure, the angle of legs at their closed condition may be made relatively small, e.g. between 10°-14°, most preferably 12°.

A heat sensor section 50 is provided at or in the vicinity of central portion within the tip 4a to detect the temperature at the end portion of tip 4a, with the output of the sensor section 50 being transmitted to a control circuit (not shown) which controls the power supply to the heating coil 41 in response to the output of the sensor section 50. For example, when the temperature at the tip 4a is lower than a predetermined threshold value, the control circuit turns on the power supply. When the temperature at the tip 4a is higher than another predetermined threshold value, the control circuit turns off the power supply. Thus, the temperature at the tip is maintained within a given range. As an alternative, the threshold for the heat control may be a single value to maintain the temperature at a desired value.

The sensor section 50 includes a temperature sensor 52 at the end portion of the sensor section 50 where the sensor section is in contact with the movable tip 4a. In the rear of the sensor 52 is provided a sensor insulating pipe 53 which forms a passage or conduit for the lead wire 51 for the sensor, and which also serves to keep the sensor 52 distant from or off the heater 40, preventing direct conduction of heat from the heater 40 to the sensor 52.

It is common with conventional devices that a heater is provided within a tip. With this arrangement, it is likely that the temperature sensor is provided close to the heater and that the temperature sensor detects the heat of the heating coil, thereby deteriorating the accuracy of the temperature sensing at the tip. According to the present embodiment having the construction described above, it is less likely that the temperature sensor 52 directly detects the heat of the heating coil 41, thereby improving accuracy of sensing of the temperature at the tip.

Figure 8:
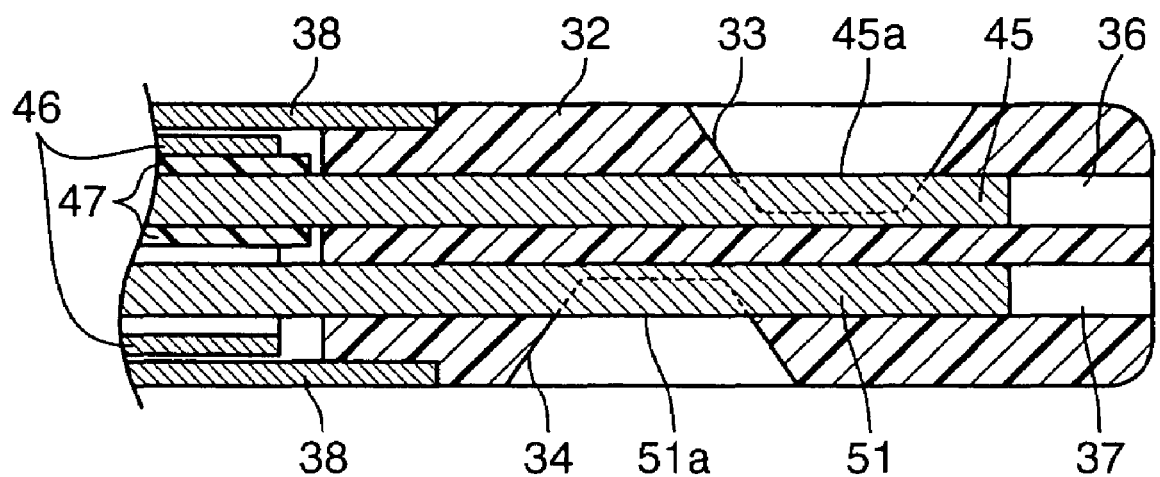
FIG. 8 is a cross-sectional view taken along of FIG. 6A.

The sensor lead wire 51 and heater lead wire 45 are covered by the heater insulting tube 44 and sensor lead insulating tube 46 and led to the plug 32 via the interior of the protective pipe 38. FIG. 8 is a cross section taken along V-V of FIG. 6A to mainly show internal structure of the plug 32. The heater lead wire 45 is covered by a heater lead insulating tube 47 which in turn is covered by a sensor lead insulating tube 46 along with the sensor lead wire 51. Accordingly, the heater lead wire 45 and the sensor lead wire 51 are insulated from each other and from the protective pipe 38 as well. The rear ends of those lead wires are respectively inserted into and held by a heater wire receiving hole 36 and a sensor wire receiving hole 37 which are formed in the plug 32. The plug 32 is formed with a first opening or notch 33 and a second opening or notch 34 which are axially shifted from each other and which respectively reach the heater wire receiving hole 36 and the sensor wire receiving hole 37. Accordingly, the exposed portion 45a of the heater lead wire 45 is exposed through the first opening or notch 33 and the exposed portion 51a of the sensor lead wire 51 is exposed through the second opening or notch 34.

The exposed portion 45a of the heater lead wire 45 and the exposed portion 51a of the sensor lead wire 51 are in contact with and electrically connected with corresponding electric terminals (not shown) provided on the movable sleeve 6a. In other words, those exposed portions 45a and 51a serve as electric terminals in the movable leg 3a. The heater lead wire 45 and the sensor lead wire 51 are nickelplated for the portions respectively including the exposed portions 45a and 51a to reduce contact resistances. Those structures of the present embodiment contribute to the compactness in size and cost reduction of the device 1, as compared with conventional devices which are provided with electric terminals to be connected with lead wires.

It is to be noted that, in the present embodiment, the stationary leg 3b has the same structure as that of the movable leg 3a. Namely, a leg which has the structure of the movable leg 3a and is fixedly fitted in the stationary sleeve 6b, serves as the stationary leg 3b. In this way, the legs of the same structures are used for the movable leg 3a and the stationary legs 3b, thereby reducing the production cost.

Figure 9A:
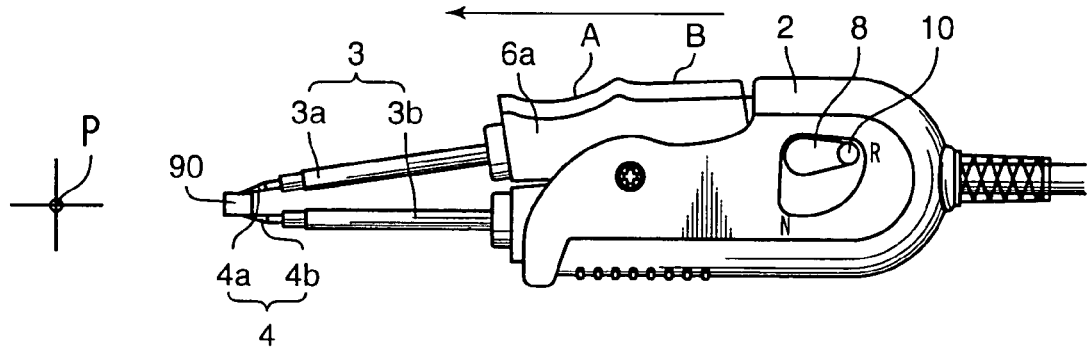
Figure 9B:
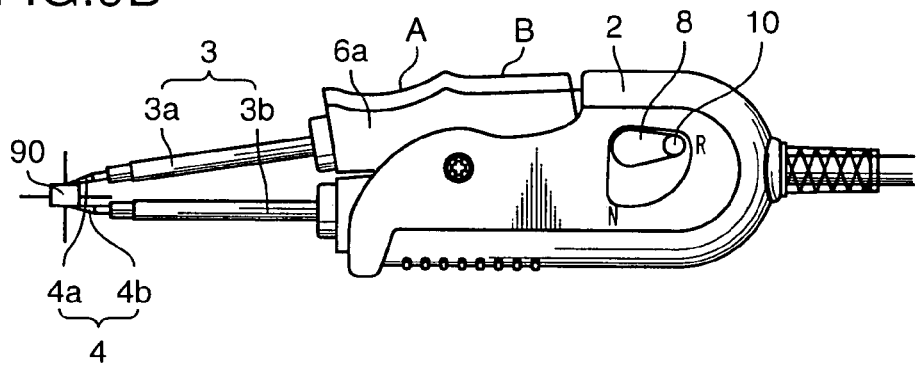
Figure 9C:
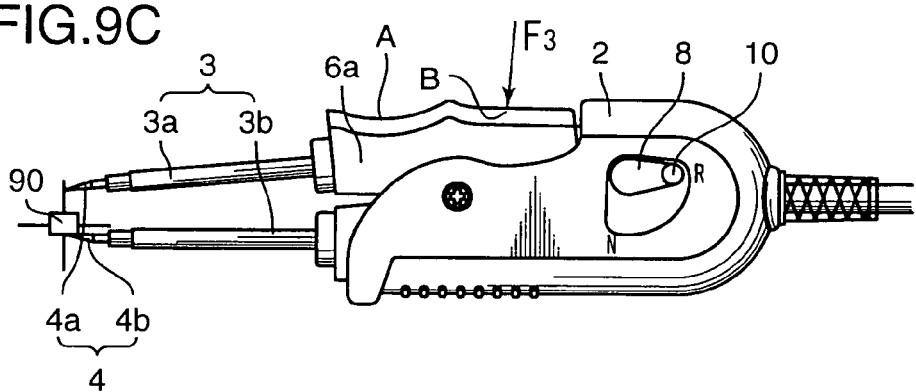
Figure 9D:
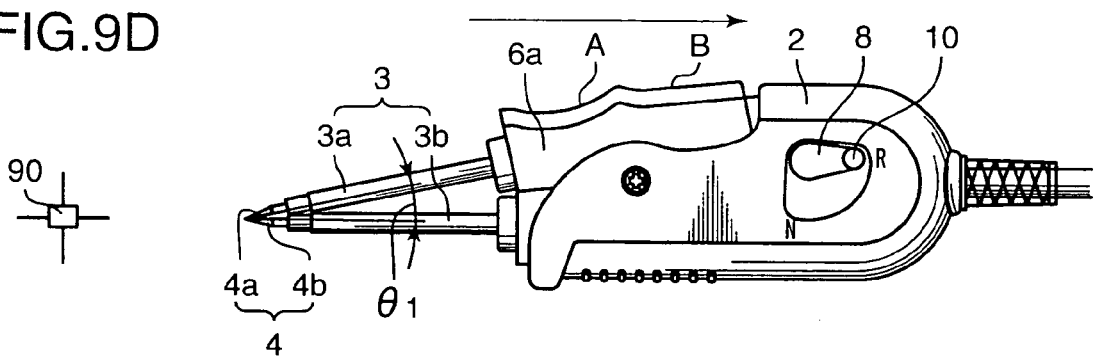

Next, description will be made of the operation of the electric part handling device 1 of the embodiment as described above. FIGS. 9A through 9D illustrate the process of installing an electric part 90 on a installing position P on a substrate (not shown) with the device 1 being set to the reverse condition. Of the figures, FIG. 9A illustrates the condition of the device 1 before the installation of the part 90, FIG. 9B illustrates the device 1 while the part 90 is being installed, FIG. 9C illustrates the device 1 just after the installation of the part 90, and FIG. 9D illustrates the device 1 some time after the installation of the part 90. As shown in FIG. 9A, the switching lever knob 10 is registered with the mark R to indicate that the switching lever 8 is set to a reverse bias position to revise-bias the movable leg 3a and close the legs 3 in free condition. The part 90 held between the tips 4a and 4b is an electric tip part such as a small resistor or capacitor each side of which is several millimeters long. The reverse condition is advantageous for installing such a small or tiny electric part 90 such as the tip part, and efficiency of operation is shown when the part is installed in a narrow area.

In operation, an operator holds the housing 2 and depresses the manipulation portion B of the movable sleeve 6a to open the legs 3 and position the tips 4 on opposite sides of the part 90. Then, the operator release the force applied to the manipulation portion B to allow the legs 3 to close by the biasing force of the spring 12 and hold the part 90 between the tips 4 as shown in FIG. 9A. Once the part 90 is held between the tips 4, the part 90 is kept in the held-condition by means of the biasing force and it is unnecessary for the operator to apply another force for the holding of the part 90 between the tips 4. Then, holding the housing 2 lightly, the operator may bring the part 90 to the installing position P as shown by arrow in FIG. 9A. The installing position P is a predetermined position on a substrate where the part 90 is to be installed.

Then, as shown in FIG. 9B, the operator may position the part 90 at the installing position. At this time, the operator is only required to hold the housing lightly and need not exert another force so that the operator can make delicate positioning easily. In addition, as the legs 3 and tips 4 are formed to be substantially straight and the included angle of the legs 3 at their closed positions is set around 12° (preferably 10°-14° and most preferably 12°), an appropriate distance is ensured between the part 90 and the operator's hand to prevent as much as possible the tips 4 from hiding the part 90 and installing position P and deteriorating visibility of the part 90 and installing position P. Still further, the tips 4 can come into the installing position P even if the installing position P is in a narrow area so that efficiency of operation is improved. The advantages of the embodiment as described above is significant when the part 90 is small in size and required accuracy for the positioning is high.

After the part 90 has been positioned at the installing position P, the part 90 is soldered on the substrate. At that time, the operator is not required to exert an operating force to the movable sleeve 6a but may only hold the housing 2 lightly for the soldering operation so that shaking of hand is avoided as much as possible.

After completion of soldering, the operator may release the part 90 by applying an operating force F3 to the manipulation portion B of the movable sleeve 6a to open the legs 3. Some time after that, the operator may remove the device 1 from the part 90 and complete the part installing process.

The normal condition may be used for removing the part from a substrate as is done with a conventional device. In this case, the switching lever 8 is set to a normal bias condition where the switching lever knob 10 is registered with the mark N and the movable leg 3a is biased clockwise to open the legs 3 in free condition. The operator may position the stationary tip 4b at one side of a part 90 and apply an operating force to the manipulation portion A of the movable sleeve 6a to close the legs 3 against the biasing force and hold the part 90 therebetween. Then, heat of the tip is applied to the solder, which is then molten, and the part 90 is removed. In this case, good visibility and efficiency of operation in the narrow area is ensured.

As an embodiment of the present invention has been described in the above, the present invention is not limited to the particular structure and operation of the embodiment, but may be varied and modified within the spirit and scope of the invention as will be claimed in the attached claims. For example, the biasing condition of the device 1 may be reverse only. Relying on the kind of operation and/or convenience of an operator, the device may be used in reverse condition only. In such a case, no problem occurs even if the device is designed to be used only in the reverse bias condition. It is appreciated by those skilled in the art that the removal of the part 90 may also be made by the device 1 in reverse bias condition. Accordingly the device may be simpler in structure and compact in size and may be manufactured with reduced cost, without affecting efficiency of operation.

In another modification, separated biasing members such as a pair of springs may be provided for normal and reverse biasing instead of providing a single spring commonly used for the normal and reverse biasing. With that separated biasing structure, the degree of freedom is increased in the determination of biasing force for the normal and reverse biasing.

The biasing member is not limited to the torsion coil spring but may be compression coil spring, or other types of elastic member such as various types of springs such a leaf spring and torsion bar spring, or rubber.

The biasing member commonly used for normal and reverse biasing may take other forms, such as a mechanism making use of fluid pressure. The biasing condition switching mechanism is not limited to the link mechanism as employed in the embodiment, but may take various forms depending on the biasing member to be employed.

Both legs may be made movable instead of one of legs being made movable. The opening and closing of the legs may be made with one of the legs being translated toward and from the other.

Figure 10A:
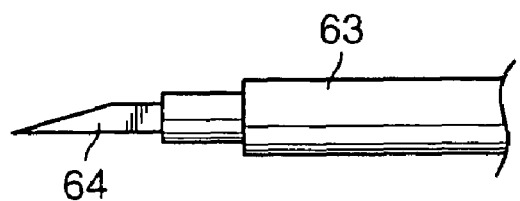
Figure 10B:
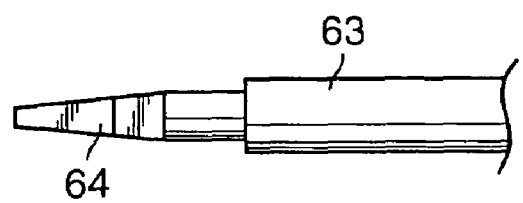

The shape of the end portion of the tip 4 may not be limited to the triangle in front elevation, but may take various shapes depending on the shapes and sizes of the parts to be held by the tips. FIGS. 10 and 11 show variation of the tips 4. FIGS. 10A and 11A are front elevations, FIGS.

Figure 10C:
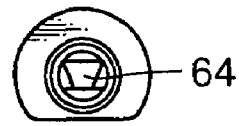
Figure 11A:
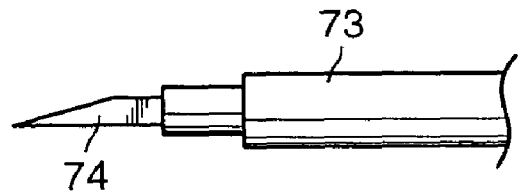
Figure 11B:
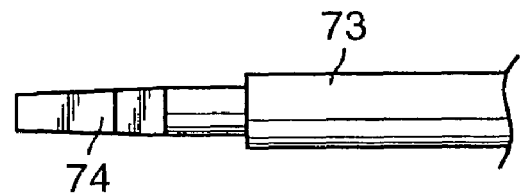
Figure 11C:
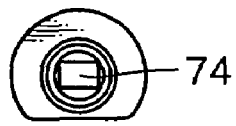

10B and 11B are plane views and FIGS. 10C and 11C are left side elevations. The tip 64 provided on the leg 63 shown in FIG. 10 is trapezoidal and tapered toward the end as seen in the plane view. The tip 74 provided on the leg 73 shown in FIG. 11 has large width at the end portion and has a trapezoidal shape close to a rectangular shape slightly tapered toward the end as seen in the plane view.

What is claimed is:

1. A handheld electric part handling device comprising:
   a pair of first and second legs respectively provided, at their free ends, with contact pieces for holding the part therebetween; at least the first leg being movable toward and away from the second leg to close and open the legs;
   a biasing member for biasing the first leg in a first direction to open the legs, and in a second direction to close the legs;
   a switching member for switching the biasing direction of the biasing member between the first and second directions; and
   a manipulation member manipulated to open or close the legs against the biasing force of the biasing member, the manipulation member having a first portion manipulated against the biasing force in the first direction, and a second portion manipulated against the biasing force in the second direction.

2. The handheld electric part handling device according to claim 1, further comprising a housing on which the second leg is fixed, and a movable sleeve movable relative to the housing and for holding the first leg, and wherein the movable sleeve is pivotally supported on a shaft to pivot around the shaft, the switching member includes a switching lever pivotally supported on the housing to swing between a first position and a second position, and the biasing member includes an elastic member extended between the switching lever and the movable sleeve to bias the movable sleeve in the first direction when the switching member is at the first position, and in the second direction when the switching member is at the second position.

3. The haudheld electric part handling device according to claim 2, wherein the elastic member includes a tension coil spring connected to the switching lever at a first connecting point and to the movable sleeve at a second connecting point and arranged such that the first connecting point is on one side of an imaginary line passing through the second connecting point and an axis of the shaft when the switching lever is at the first position, and that the first connecting point is on the other side of the imaginary line when the switching lever is at the second position.

4. The handheld electric part handling device according to claim 1, wherein said first leg is capable of providing power to heat generating member near its contact piece and said second leg is capable of providing power to heat generating member near its contact piece, and the handheld electric part handling device further comprises a housing having a first sleeve and a second sleeve adapted to receive the first leg and the second leg respectively, where the first sleeve is adapted to pivot with respect to the second sleeve and is to be biased in a first bias direction and a second bias direction, wherein the first bias direction the first and second sleeves are biased away from each other, wherein in the second bias direction the first and second sleeves are biased towards each other.

5. The handheld electric part handling device according to claim 4, wherein the switching member includes a lever adapted to move between a first position and a second position, where in the first position the first sleeve is biased in the first bias direction, and in the second position the first sleeve is biased in the second bias direction.

6. The handheld electric part handling device according to claim 4, wherein the first sleeve has a first recess and a second recess, where the first sleeve pivots about a pivot point that is between the first and second recesses such that operation on the first recess causes the first and second sleeve to close and operation on the second recess causes the first and second sleeve to open.

7. The handheld electric part handling device according to claim 4, wherein the second sleeve is fixed within the housing.

8. The handheld electric part handling device according to claim 4, wherein when the first and second sleeves are closed so that the contact pieces of the first and second legs touch each other, the included angle of the first and second legs is between 10° and 14°.

9. The handheld electric part handling device according to claim 8, wherein the included angle is 12°.

* * * * *